(12) United States Patent
Umeda

(10) Patent No.: US 8,770,690 B2
(45) Date of Patent: Jul. 8, 2014

(54) ELEMENT SUBSTRATE AND PRINTED WIRING BOARD

(71) Applicant: Canon Kabushiki Kaisha, Tokyo (JP)

(72) Inventor: Kengo Umeda, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/855,531

(22) Filed: Apr. 2, 2013

(65) Prior Publication Data

US 2013/0222451 A1    Aug. 29, 2013

Related U.S. Application Data

(63) Continuation of application No. 12/963,199, filed on Dec. 8, 2010, now Pat. No. 8,432,183.

(30) Foreign Application Priority Data

May 14, 2010 (JP) .................................. 2010-112291

(51) Int. Cl.
*H03K 17/16* (2006.01)

(52) U.S. Cl.
USPC ............................................. 347/9; 327/379

(58) Field of Classification Search
None
See application file for complete search history.

(56) References Cited

U.S. PATENT DOCUMENTS 6,597,731 B1 *  7/2003  Shuholm ..................... 375/220
7,671,882 B2 *  3/2010  Ozasa et al. ................. 347/237

FOREIGN PATENT DOCUMENTS

| JP | 2005-131875 A | 5/2005 |
|---|---|---|
| JP | 2009-065508 A | 3/2009 |
| JP | 2009-149036 A | 7/2009 |
| JP | 2010-010427 A | 1/2010 |

* cited by examiner

*Primary Examiner* — Crystal L Hammond
(74) *Attorney, Agent, or Firm* — Canon USA, Inc., IP Division

(57) ABSTRACT

An element substrate includes a plurality of terminals, a first receiving circuit and a second receiving circuit each receiving a differential signal via one of the terminals included in the plurality of terminals, a driving circuit including a first input unit for inputting a first signal and a second input unit for inputting a second signal and driving a driving element based on the first signal and the second signal, and a setting circuit for setting a first connection state of connecting an output from the first receiving circuit to the first input unit and connecting an output from the second receiving circuit to the second input unit, and a second connection state of connecting an output from the first receiving circuit to the second input unit and connecting an output from the second receiving circuit to the first input unit based on an externally input signal.

5 Claims, 8 Drawing Sheets

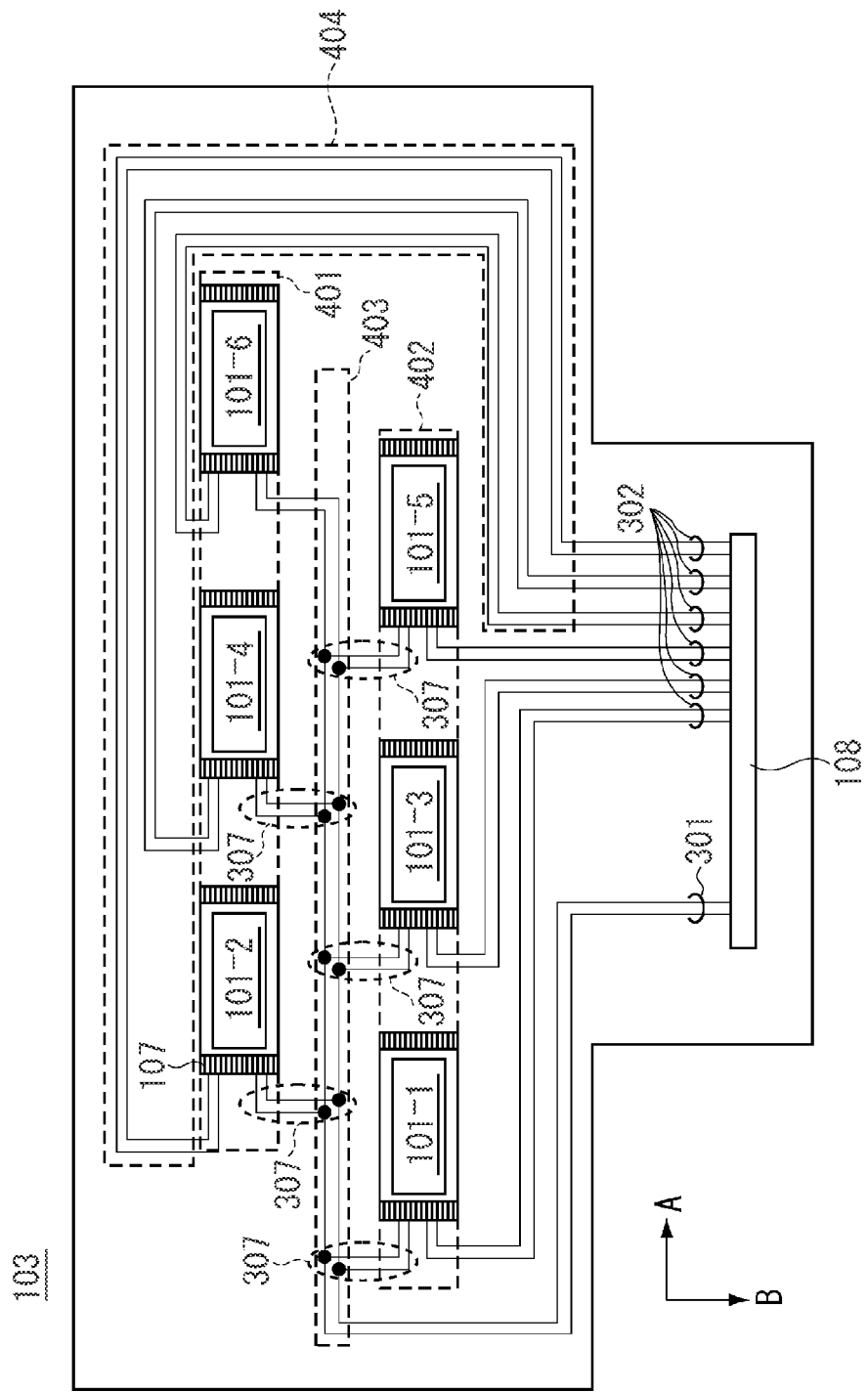

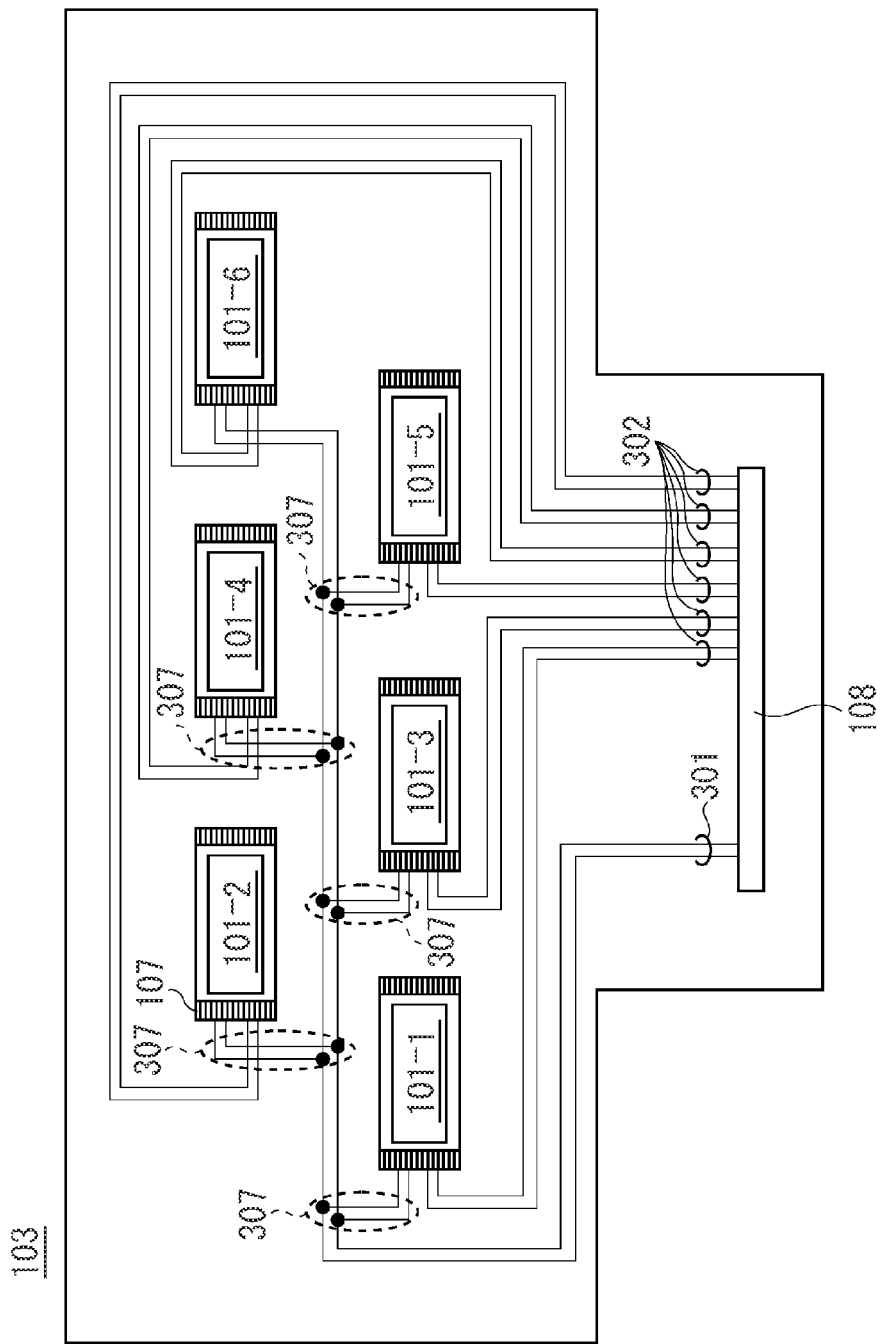

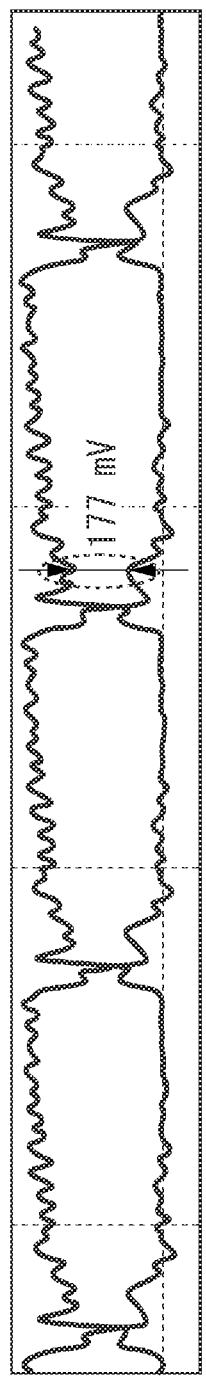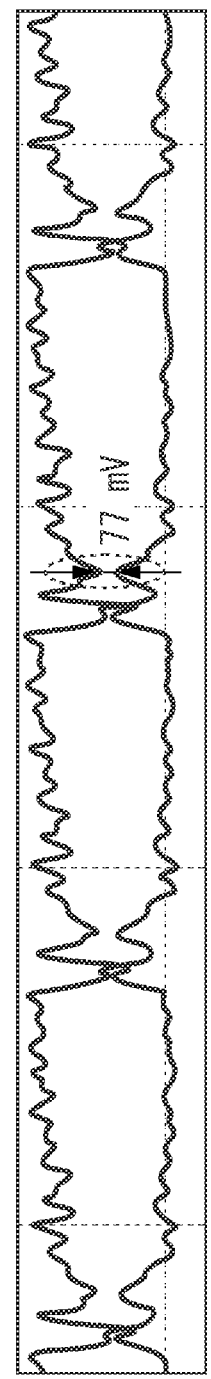
FIG. 5A
FIG. 5B

ELEMENT SUBSTRATE AND PRINTED WIRING BOARD

CROSS REFERENCE OF RELATED APPLICATIONS

This application is a Continuation of U.S. patent application Ser. No. 12/963,199 filed on Dec. 8, 2010 which claims the benefit of Japanese Patent Application No. 2010-112291 filed May 14, 2010, which is hereby incorporated by reference herein in its entirety.

BACKGROUND OF THE INVENTION

1. Field of the Invention

The present invention relates to a printed wiring board having an element substrate and a differential signal line for inputting a differential signal.

2. Description of the Related Art

Japanese Patent Application Laid-Open No. 2007-296638 discusses a full-line recording head. A plurality of recording element substrates is arranged in a staggered pattern on a printed wiring board of the recording head.

A clock signal (CLK) is a commonly-used signal in the recording element substrates, and one-to-many connection (multi-drop connection) is desired from the viewpoint of wiring space of the printed wiring board. On the other hand, since different signals are used for the recording element substrates as image data signals (DATA), one-to-one connection (Point-to-Point connection) is desired.

Developments for attaining higher frequency and speed of the image data signal and the clock signal are in progress to attain a high speed recording operation and high image quality. Therefore, it is necessary to keep a stub (branch wiring) as short as possible to ensure good waveform quality when performing the one-to-many connection (multi-drop connection) in wiring of signal lines.

However, in the state where the recording element substrates are arranged in a staggered pattern, a length of the stub is increased. Therefore, since effective characteristic impedance of the signal line is reduced, signal reflection tends to occur, and an amplitude of each of the signals is reduced, resulting in deterioration of signal waveform quality.

SUMMARY OF THE INVENTION

According to an aspect of the present invention, there is provided an element substrate including a plurality of terminals, a first receiving circuit and a second receiving circuit each receiving a differential signal via a predetermined terminal included in the plurality of terminals, a driving circuit including a first input unit for inputting a first signal and a second input unit for inputting a second signal and driving a driving element based on the first signal and the second signal, and a setting circuit for setting a first connection state of connecting an output from the first receiving circuit to the first input unit and connecting an output from the second receiving circuit to the second input unit and a second connection state of connecting an output from the first receiving circuit to the second input unit and connecting an output from the second receiving circuit to the first input unit based on an externally input signal.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

FIG. 2 is a plan view illustrating a printed wiring board 103.

FIG. 4 is a plan view illustrating a printed wiring board to which the present invention is not applied.

FIGS. 5A and 5B are diagrams each illustrating a simulation result of an amplitude of a signal.

DESCRIPTION OF THE EMBODIMENTS

Various exemplary embodiments, features, and aspects of the invention will be described in detail below with reference to the drawings.

Figure 1A:
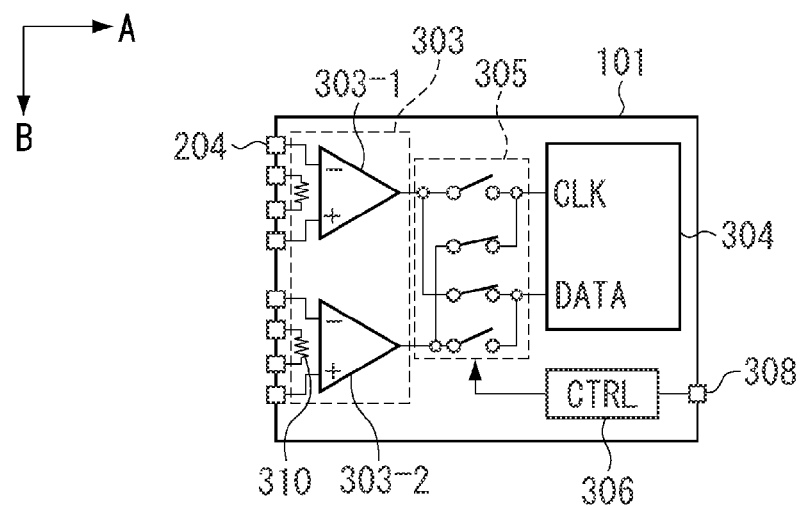
FIGS. 1A and 1B are diagrams each illustrating a circuit layout of a recording element substrate 101.

FIG. 1A is a diagram illustrating a circuit layout of a recording element substrate 101 as an element substrate. The recording element substrate 101 includes a receiving circuit 303, a switching circuit 305, a driving circuit 304, a switching control circuit 306, a control terminal 308, and terminals (pad) 204.

The receiving circuit 303 includes two circuits (303-1, 303-2) for receiving differential signals. The driving circuit 304 includes a first input unit for inputting a clock signal CLK (first signal) and a second input unit for inputting a data signal DATA (second signal). The driving circuit 304 drives a recording element based on the first signal and the second signal. The terminals 204 are arranged along a direction of an arrow B.

An output from the first receiving circuit 303-1 and an output from the second receiving circuit 303-2 are input into the switching circuit 305. In the switching circuit 305, it is possible to set a first connection state of connecting the output from the first receiving circuit to the first input unit and connecting the output from the second receiving circuit to the second input unit, or a second connection state of connecting the output from the first receiving circuit to the second input unit and connecting the output from the second receiving circuit to the first input unit.

The switching circuit 305 switches between the first connection state and the second connection state based on a signal input from the control terminal 308. For example, the first connection state is set when a logical level of the signal input from the control terminal 308 is a low level, while the second connection state is set when the logical level of the signal input from the control terminal 308 is a high level. In other words, the switching circuit 305 is a setting circuit for setting the signal connection.

Illustrated in FIG. 2 is a configuration of the printed wiring board 103 in which the recoding element substrates 101 are provided. Six recording element substrates 101 are provided on the printed wiring board 103. A region 401 (first region)

and a region 402 (second region) are defined for the recording element substrates 101, so that the plurality of recording element substrates 101 is arranged along a predetermined direction (arrow A) as illustrated in FIG. 2.

A signal line pair (first differential signal lines) for supplying the clock signals is arranged in a region 403 (third region) defined between the region 401 and the region 402. Signal lines 301 are branched in the region 403. A signal line pair (second differential signal lines) 302 for supplying the data signals is arranged in a region 404 (fourth region) defined outside the region 401 and the region 402.

The printed wiring board 103 is provided with terminal arrays 107 each having a plurality of terminals for signal connection with the recording element substrate 101. Also, the printed wiring board 103 is provided with a terminal array 108 having a plurality of terminals for signal connection with another substrate.

Figure 3:
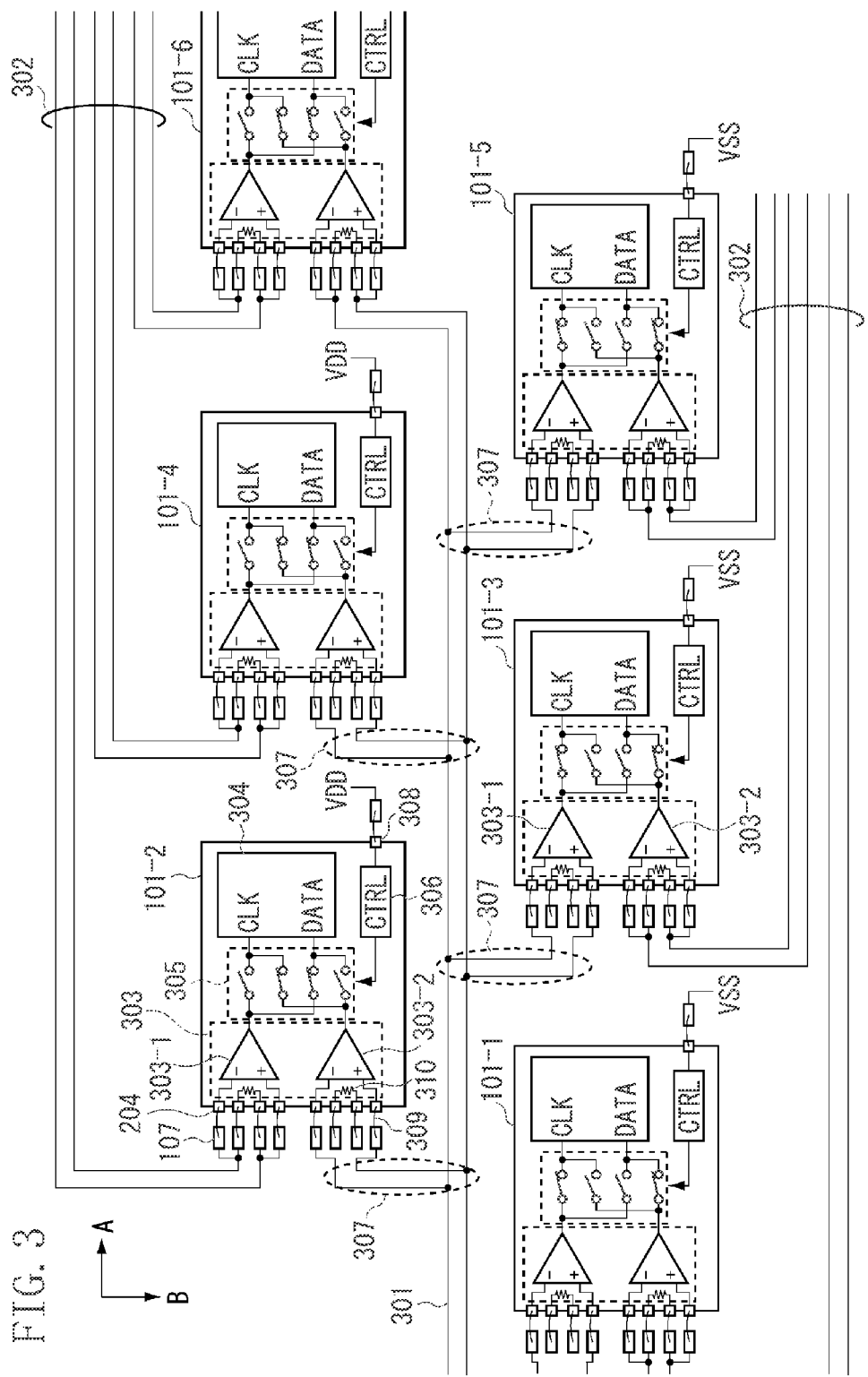
FIG. 3 is a partially enlarged view illustrating a part of FIG. 2.

FIG. 3 is a partially enlarged view illustrating a part of FIG. 2. The terminals included in the terminal arrays 107 of the printed wiring board are connected to the terminals 204 of the recording element substrate 101 by wire bonding 309. Termination of the signal lines is performed using a resistor 310 (the signal lines are short-circuited via the resistor 310) in the recording element substrate 101.

Referring to FIG. 3, the termination of the signal line pair (second differential signal lines) of one-to-one connection is performed by the resistor 310 in each of the recording element substrates 101. The signal line pair (first differential signal lines) of one-to-many connection is connected only to the termination resistor 310 for the termination in the recording element substrate 101-6.

Referring to FIG. 3, a high level signal (e.g. source voltage VDD) is supplied to each of the control terminals 308 of the element substrates 101-2, 101-4, and 101-6. A low level signal (e.g. earth VSS) is supplied to each of the control terminals 308 of the element substrates 101-1, 101-3, and 101-5.

When a control signal is input to the element substrate 101 from the control terminal 308, the switching circuit 305 is in the connection state illustrated in FIG. 3. As described above, the connection state of the switching circuit 305 is set by inputting the control signal input from the external part of the element substrate 101.

With the above-described configuration, it is possible to connect the receiving circuit that is closer to the differential signal lines 301 (clock signal) in the configuration that each of the recording element substrates 101 includes the plurality of receiving circuits. For example, the receiving circuit 303-2 of the recording element substrate 101-2 is connected to the differential signal lines 301 (clock signal).

Also, the receiving circuit 303-1 of the recording element substrate 101-3 is connected to the differential signal lines 301 (clock signal). Thus, it is possible to suppress a length of the stub 307 of the differential signal lines 301, thereby suppressing signal reflection and deterioration of signal quality.

Figure 1B:
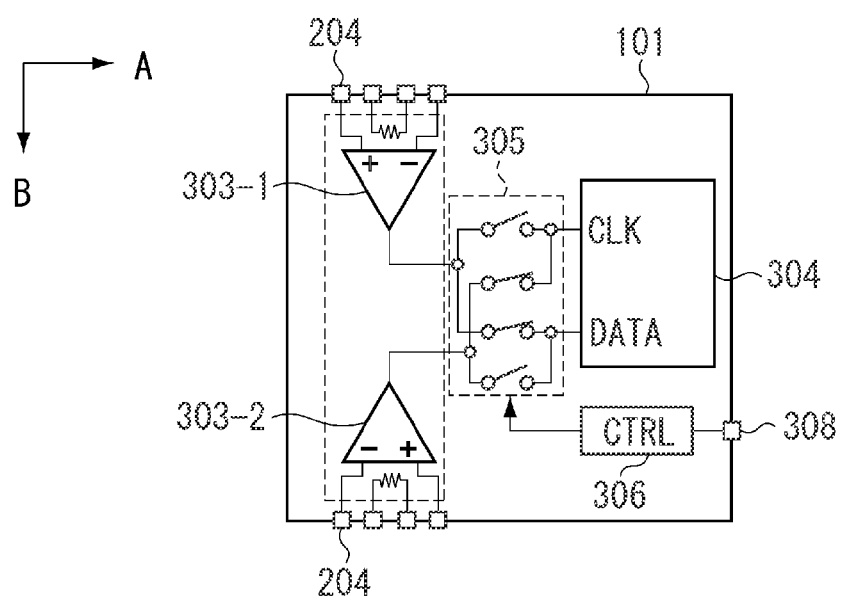

FIG. 1B is a diagram illustrating a second exemplary embodiment. Since the switching circuit 305, the driving circuit 304, and the like of the element substrate 101 are the same as those of the first exemplary embodiment, description thereof will not be repeated. FIG. 1B is different from FIG. 1A by the positions of the terminals 204, and the terminals 204 are arranged along an arrow A in FIG. 1B. Thus, it is possible to suppress the length of the stub 307 of the differential signal lines 301 provided in the region 403 illustrated in FIG. 2, thereby suppressing signal reflection and deterioration of signal quality.

The exemplary embodiments of the present invention have been described above. Illustrated in FIG. 4 is a plan view of a printed wiring board when the present invention is not applied. As illustrated in FIG. 4, the positions of the receiving circuits of the recording element substrates 101-2 and 101-4 are distant from the differential signal lines 301. Therefore, a length of the stub 307 connecting to the recording element substrates 101-2 and 101-4 are longer than the stub 307 connecting to the recording element substrates 101-1, 101-3, and 101-5.

FIGS. 5A and 5B are diagrams each illustrating a simulation result of an amplitude of a transferred signal. Illustrated in FIG. 5A is the signal amplitude when the present invention is applied (state of FIG. 2). Illustrated in FIG. 5B is the signal amplitude when the present invention is not implemented (state of FIG. 4).

The minimum amplitude is 177 mV when the present invention is implemented (FIG. 5A), while the minimum amplitude is 77 mV when the present invention is not applied (FIG. 5B). It is apparent that the difference between the signal amplitudes is about 100 mV. In other words, signal quality is largely improved by implementing the present invention, thereby realizing suppression of data transfer errors.

(Description of Recording Head)

Figure 6:
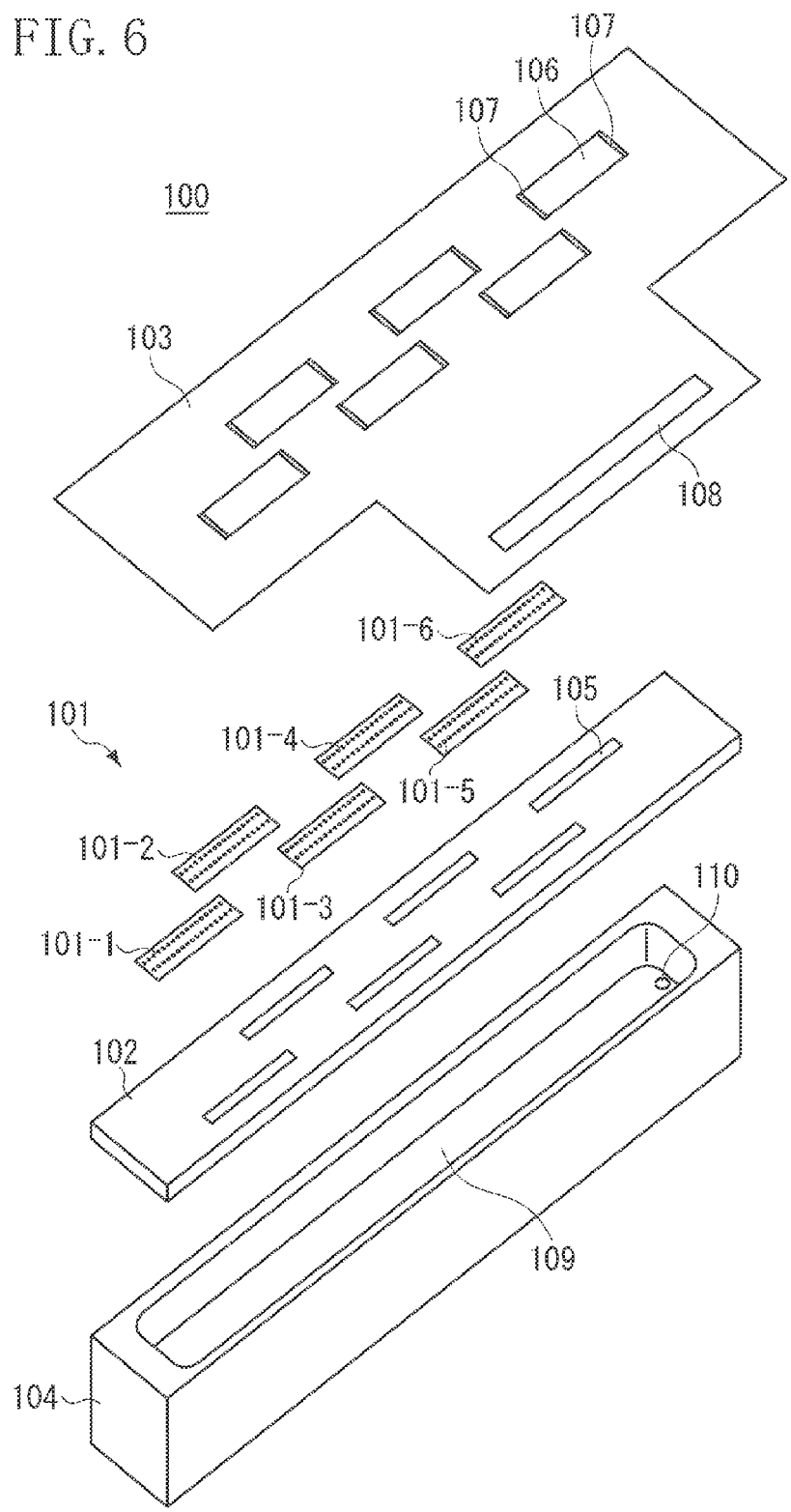
FIG. 6 is an exploded perspective view illustrating a recording head.

A recoding head will be described as one example of a device. FIG. 6 is an exploded perspective view illustrating a recording head. A recording head 100 includes recording element substrates 101, a support member 102, a printed wiring board 103, an ink supply member 104, and the like. In FIG. 6, six recording element substrates 101 are arranged in a staggered pattern. It is possible to obtain a recording head having a larger print width by increasing the number of recording element substrates 101 to be mounted.

The recording element substrate 101 is a device for discharging an ink, including a Si substrate 701 having a thickness of 0.05 to 0.625 mm and provided with a long groove-like ink supply port 702 formed by wet etching, dry etching, or the like with high accuracy as illustrated in FIG. 7.

A plurality of heaters 703 and driving circuits (recording element), which are arranged across the ink supply port 702, and each of which is provided for driving one of the heaters 703 at a predetermined position for a predetermined time are formed on a surface of the Si substrate 701 by a film formation technique, and a terminal 204 for electrical connection to the printed wiring board 103 is formed at each of opposite ends in a longitudinal direction of the recording element substrate 101.

Also, a discharge port forming member 705 made from a resin material is formed on the Si substrate 701, and a plurality of discharge ports 706 corresponding to the heaters 703 and an ink storage chamber 707 are formed by a photolithography technique.

In FIG. 6, the support member 102 is a member for supporting and fixing the recording element substrate 101 and formed from alumina (Al2O3) having a thickness of 0.5 to 10 mm, for example. The material of the support member 102 is not limited to alumina, and a material having a linear expansion rate similar to the recording element substrate 101 and high rigidity, may be used. Examples of the material include silicon (Si), aluminum nitride (AlN), zirconia, silicon nitride ($Si_3N_4$), silicon carbide (SiC), molybdenum (Mo), tungsten (W), and the like.

An ink supply port 105 is formed on the support member 102 at a position corresponding to the ink supply port 702 of the recording element substrate 101. The recording element substrate 101 is fixed to the support member 102 by bonding with a first bonding agent with high position accuracy.

The printed wiring board 103 is a member for transmitting and supplying an electric signal and a source voltage to the recording element substrate 101 for discharging the ink, and, for example, a flexible wiring board having a two-layer structure in which a wiring is formed on each of both sides of the substrate and a surface layer is covered with a protection film, is used.

As illustrated in FIG. 6, the printed wiring board 103 has openings 106 for mounting the recording element substrates 101. The printed wiring board 103 has terminals 107 corresponding to the input terminals 204 of the recording element substrates 101 and a terminal (e.g. connector) for receiving the electric signal from a recording device main body.

The printed wiring board 103 is fixed by bonding with a second bonding agent to the surface of the support member 102 on which the recording element substrates 101 are bonded. Gaps between the openings 106 and the recording element substrates 101 are sealed with a sealant.

The terminals 107 of the printed wiring board 103 and the input terminals 204 of the recording element substrates 101 are electrically connected to each other by a wire bonding technique or the like using a gold wire, and eclectic connection parts are sealed with a sealant. The printed wiring board 103 is bent and fixed at each of both sides of the support member 102, so that electric connection with the main body is easily performed.

The ink supply member 104 is a member for supplying the ink from an ink tank to the recording element substrates 101 and, for example, formed by injection molding using a resin material. An ink storage chamber 109 for supplying the ink to the plurality of recording element substrates 101 is formed in the ink supply member 104. The ink is introduced from the ink tank to the ink storage chamber 109 via an ink supply tube through an opening 110. The ink supply member 104 is bonded to the support member 102.

(Description of Recording Element Substrate)

Figure 7A:
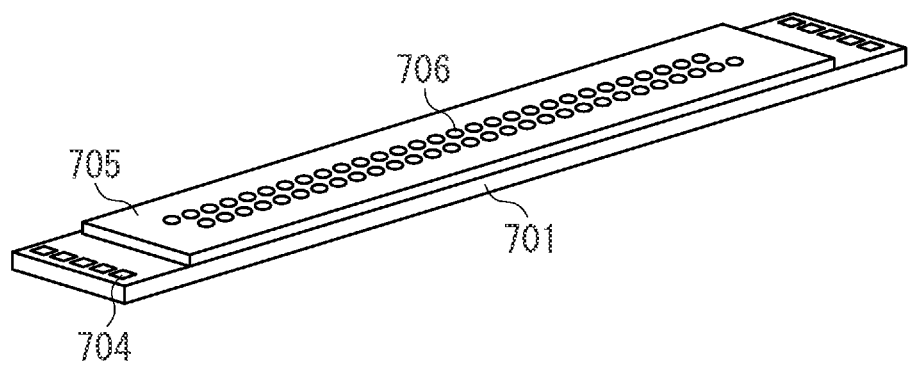
FIGS. 7A and 7B are diagrams each illustrating a recording element substrate.
Figure 7B:
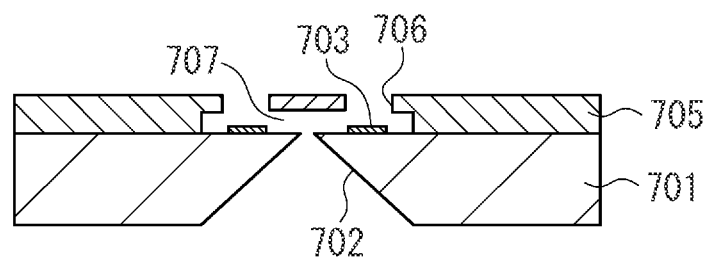

As one example of the element substrate 101, a recording element substrate serving as a driving element for driving a recording element will be described. FIGS. 7A and 7B are diagrams illustrating the recording element substrate 101. As illustrated in FIG. 7A, terminals 704 for electrical connection to the printed wiring board 103 are formed at each of opposite ends in a longitudinal direction of the recording element substrate 101. Two discharge port arrays including a plurality of discharge ports are formed.

FIG. 7B is a sectional view illustrating the recording element substrate. A long groove-like ink supply port 702 is formed on a Si substrate 701 having a thickness of 0.05 to 0.625 mm by wet etching, dry etching, or the like with high accuracy. A plurality of heaters (recording elements) 703 and driving circuits for driving the heaters 703 are formed by a film formation technique on the surface of the Si substrate 701.

A discharge port forming member 705 made from a resin material is formed on the Si substrate 701, and a plurality of discharge ports 706 corresponding to the heaters 703 and an ink storage chamber 707 communicated with the discharge ports 706 are formed by a photolithography technique.

(Description of Recording Device)

Figure 8:
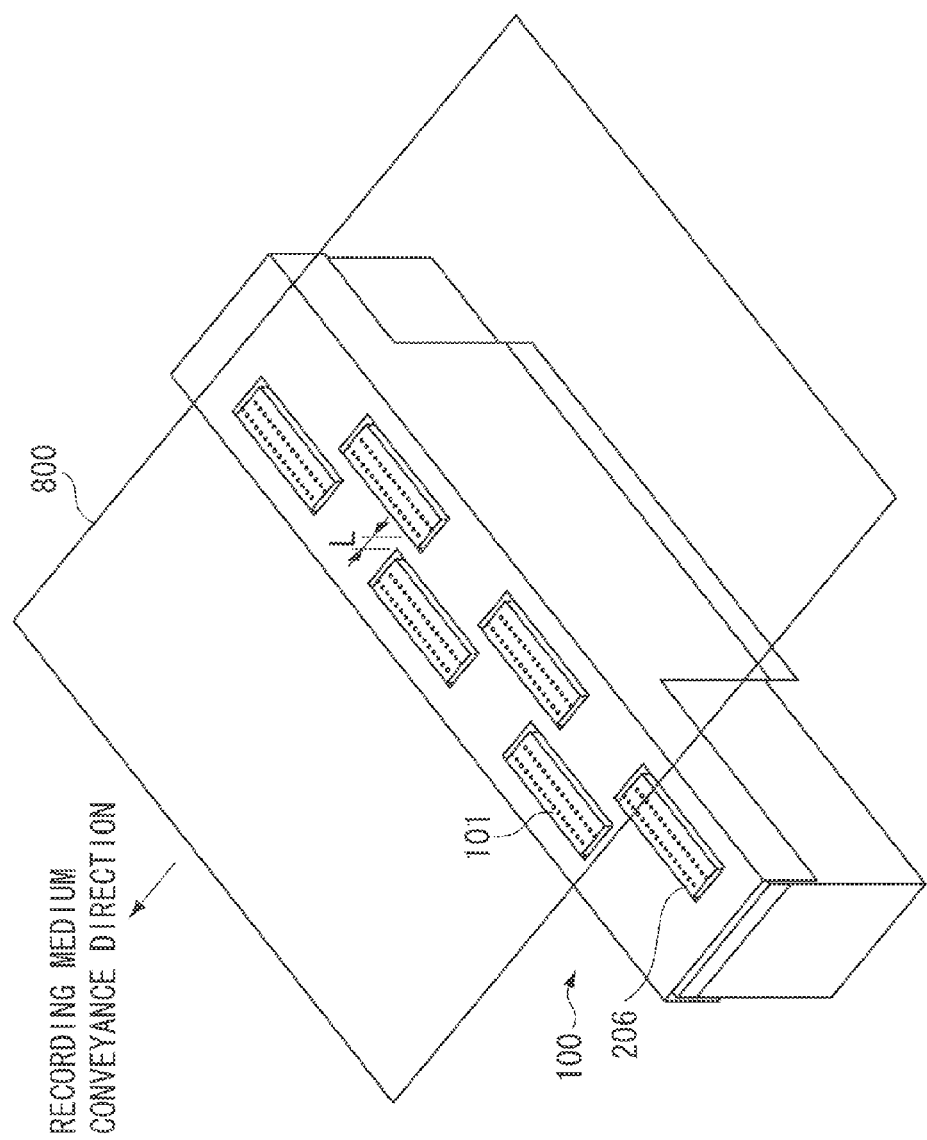
FIG. 8 is a diagram illustrating a relationship between a recording head and a conveyance direction of a recording medium 800.

FIG. 8 is a diagram illustrating a relationship between a recording head and a conveyance direction of a recording medium 800, which is viewed from a back side of the recording medium 800. In a recording operation, the recording head is fixed in the recording device, and the recording medium 800 is conveyed, followed by discharge of the ink from the plurality of discharge ports 206 on the recording element substrates 101, thereby forming an image on the recording medium 800. The recording device includes a conveying unit for conveying the recording medium 800.

Though the first and second exemplary embodiments are described above, the present invention is not limited to the above-described exemplary embodiments. For example, though the number of the element substrates to be provided on the printed wring board 103 is six in the above exemplary embodiments, the number is not limited thereto and may be four, eight, ten, or the like. Also, the driving element may be a light emitting element such as a light emitting diode (LED), and a sensor element such as a complementary metal oxide semiconductor (CMOS) sensor. As examples of the device, the present invention may be applied to a reading unit for reading an image of an original document, a display unit for displaying an image, and the like. The signals to be received by the receiving circuit are not limited to the clock signal and the data signal, and other control signals may be received.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

What is claimed is:

1. An element substrate comprising:
    a first terminal and a second terminal each for receiving a signal;
    a third terminal for receiving a control signal;
    a first receiving circuit configured to receive a signal via the first terminal;
    a second receiving circuit configured to receive a signal via the second terminal;
    a driving circuit including a first receiving portion for receiving a first signal and a second receiving portion for receiving a second signal and configured to drive a driving element based on the first signal and the second signal;
    a switch circuit configured to switch between a first connection state in which an output of the first receiving circuit is connected to the first receiving portion and an output of the second receiving circuit is connected to the second receiving portion, and a second connection state in which the output of the first receiving circuit is connected to the second receiving portion and the output of the second receiving circuit is connected to the first receiving portion; and
    a setting circuit configured to set either the first connection state or the second connection state based on the control signal.

2. The element substrate according to claim 1, wherein the first signal is a clock signal, and the second signal is a data signal.

3. The element substrate according to claim 1, wherein the driving element is a recording element.

4. The element substrate according to claim 1, wherein the first receiving circuit and the second receiving circuit convert a differential signal into a single-ended signal.

5. A printed wiring board comprising:
    the element substrates according to claim 1;
    a first signal line for commonly supplying the first signal to the element substrates;
    a plurality of second signal lines each for individually supplying the second signal to different one of the element substrates; and
    a plurality of terminals for receiving the first signal and the second signal.

* * * * *